(12) United States Patent
Ho

(10) Patent No.: US 7,674,392 B2
(45) Date of Patent: Mar. 9, 2010

(54) METHOD OF FABRICATING A HINGE

(75) Inventor: Hsien-Lung Ho, Taipei County (TW)

(73) Assignee: Touch Micro-System Technology Inc., Yangmei Township, Taoyuan County (TW)

( * ) Notice: Subject to any disclaimer, the term of this patent is extended or adjusted under 35 U.S.C. 154(b) by 291 days.

(21) Appl. No.: 11/557,110

(22) Filed: Nov. 7, 2006

(65) Prior Publication Data
US 2008/0017612 A1  Jan. 24, 2008

(30) Foreign Application Priority Data
Jul. 24, 2006  (TW) .............................. 95126954 A

(51) Int. Cl.
*C03C 15/00* (2006.01)
(52) U.S. Cl. .............................. 216/41; 216/37; 216/67; 310/309; 359/871
(58) Field of Classification Search .................... 216/41; 310/309; 359/871
See application file for complete search history.

(56) References Cited

U.S. PATENT DOCUMENTS 6,820,988 B2 *  11/2004  van Drieenhuizen et al. ..... 359/872

7,079,299 B1 *  7/2006  Conant et al. ............... 359/224
2002/0190603 A1  12/2002  Ma

FOREIGN PATENT DOCUMENTS

| CN | 1448333 A | 10/2003 |
|---|---|---|
| TW | 505613 | 10/2002 |

OTHER PUBLICATIONS

Petra Aswendt et al. NDT.net, vol. 7, No. 4, pp. 1-8, (2002).*

* cited by examiner

*Primary Examiner*—Nadine Norton
*Assistant Examiner*—Maki Angadi
(74) *Attorney, Agent, or Firm*—Winston Hsu

(57) ABSTRACT

The present invention provides a method of fabricating a hinge. First, a wafer is provided, and a hinge region and at least two through regions are defined on the wafer. The wafer in the hinge region is partially removed from a bottom surface of the wafer. Subsequently, the wafer in the through regions is completely removed from a top surface of the wafer, and the hinge is formed. Thereafter, a wafer level test is performed on the hinge of the wafer. Next, an etching process is performed to adjust the shape of the hinge. According to the method of the present invention, the thickness of the hinge is no longer limited by the thickness of the wafer, and the hinge can accept the wafer level test.

14 Claims, 12 Drawing Sheets

METHOD OF FABRICATING A HINGE

BACKGROUND OF THE INVENTION

1. Field of the Invention

The present invention pertains to a method of fabricating a hinge, and more specifically, to a method of performing a wafer level test in situ and adjusting the characteristic of a hinge according to the wafer level test.

2. Description of the Prior Art

Micro-electromechanical system (MEMS) technology is an emerging technology which highly integrates electronics and mechanics, and has been broadly adopted to fabricate various devices having electro and mechanical characteristics, such as micro sensors, micro actuators, micro motors, photosensitive switches, etc. MEMS devices generally have mechanical structures more complicated than semiconductor devices, and thus cannot be directly fabricated by standard semiconductor processes. Take the micro hinge, one of the most common structures in MEMS devices, for example, accurate shape and smooth surface conditions are strictly required for ensuring reliability and stress-bearing capability.

Please refer to FIG. 1 to FIG. 3. FIG. 1 and FIG. 2 are schematic diagrams illustrating a prior art method of forming a micro hinge 10, and FIG. 3 is a schematic diagram of a single-axis micro hinge 10 made by the prior art method. As shown in FIG. 1, a wafer 20 is first provided. An etching stop layer 22 and a photo resist pattern 24 are respectively formed on the bottom surface and the top surface of the wafer 20. As shown in FIG. 2, the bottom surface of the wafer 20 is fixed on a carrier 32 by a bonding layer 28, and an etching process is followed. Portions of the wafer 20, which are not covered by the photo resist pattern 24, are etched through until the etching stop layer 22 is reached.

As shown in FIG. 3, the micro hinge 10 is a suspension structure capable of being driven by a voltage, light beams, or a magnetic field, and thereby rotates in the direction as the arrow indicates shown in FIG. 3. Therefore, the micro hinge 10 must have an accurate shape, a smooth surface, and a uniform axis so as to guarantee reliability and stress-bearing capability.

According to the prior art method, however, equilibrium of the etching process and the thickness uniformity of the wafer 20 are not taken into consideration. Thus, the yield of the etching process cannot be controlled well because etching rates in different regions of the wafer 20 are not equal. For example, on the occasion of etching through the wafer 20, the overall area being etched varies dramatically, and leads to unexpected changes during the etching process. In addition, when the etching process is performed down to the etching stop layer 22, side-etching effect tends to occur and therefore results in an undercut 26 as shown in FIG. 2. As mentioned earlier, if the shape accuracy of the micro hinge degrades, reliability of the micro hinge will be seriously affected.

On other hand, according to the prior art method of forming the micro hinge 10, the thickness of the wafer 20 is exactly the thickness of the micro hinge 10. This leads to a great limitation in changing the thickness of the micro hinge 10. Furthermore, because the bottom surface of the micro hinge 10 is fixed on the etching stop layer 22, the micro hinge 10 cannot accept a wafer level test in situ, and be adjusted immediately. The step of removing the etching stop layer 22 might even damage the micro hinge 10.

SUMMARY OF THE INVENTION

It is therefore a primary object of the present invention to provide a method of fabricating a hinge to overcome the aforementioned problems.

In one aspect, the present invention provides a method of fabricating a hinge. According to the method, a wafer is first provided, which comprises a first surface and a second surface, and defines at least a hinge region and at least two through regions. The two through regions are respectively positioned on two sides of the hinge region. Subsequently, parts of the wafer in the hinge region are removed from the first surface of the wafer. The wafer in the two through regions is thereafter removed from the second surface of the wafer until the wafer is removed through to the first surface so as to form a hinge. Furthermore, a wafer level test on the wafer is performed. The wafer is next etched so as to adjust a geometric shape of the hinge.

Because the wafer in the hinge region is etched from the first surface of the wafer so as to control the thickness of the hinge generally, the thickness of the hinge is no longer limited to the thickness of the wafer. Furthermore, since the thickness of the hinge is thinner than the thickness of the wafer, the hinge can suspend in the wafer, accept the wafer level test, and be adjusted in situ. Consequently, the reliability and stress-bearing capability of the micro hinge is ensured.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
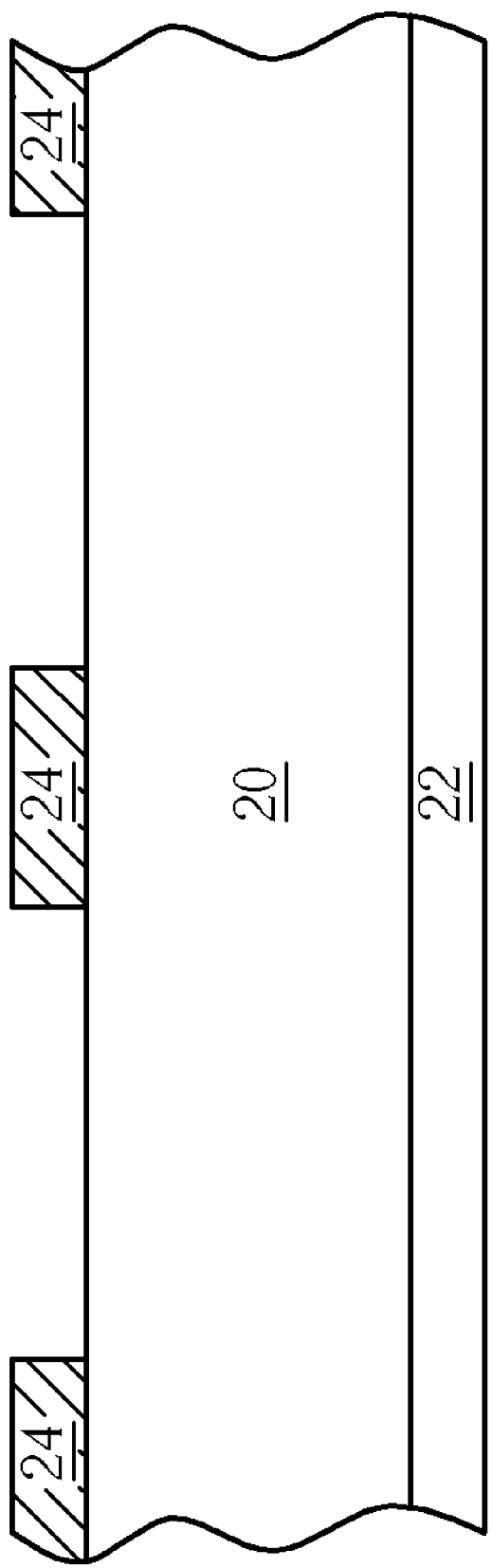
FIG. 1 and FIG. 2 are schematic diagrams illustrating a prior art method of forming a micro hinge.
Figure 2:
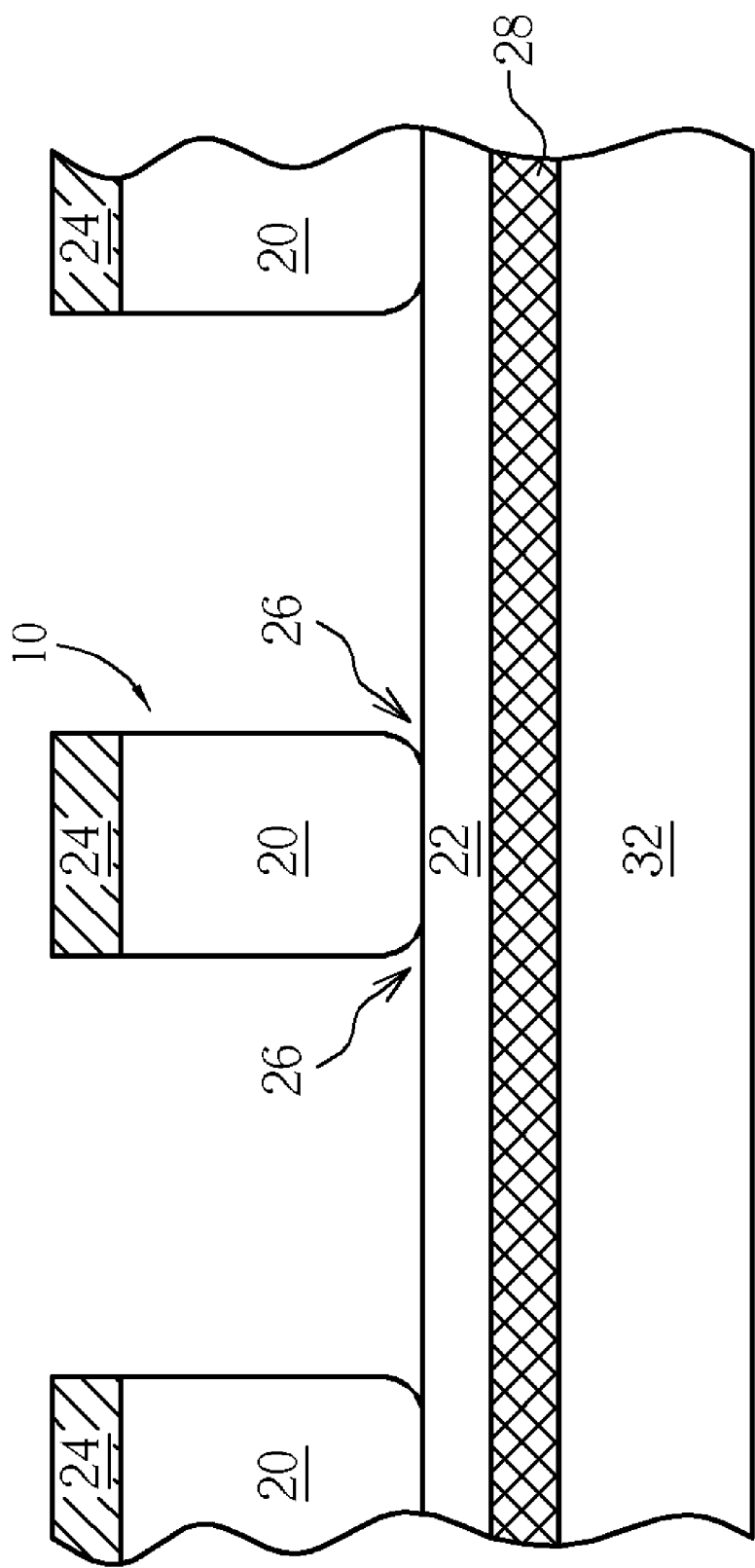
Figure 3:
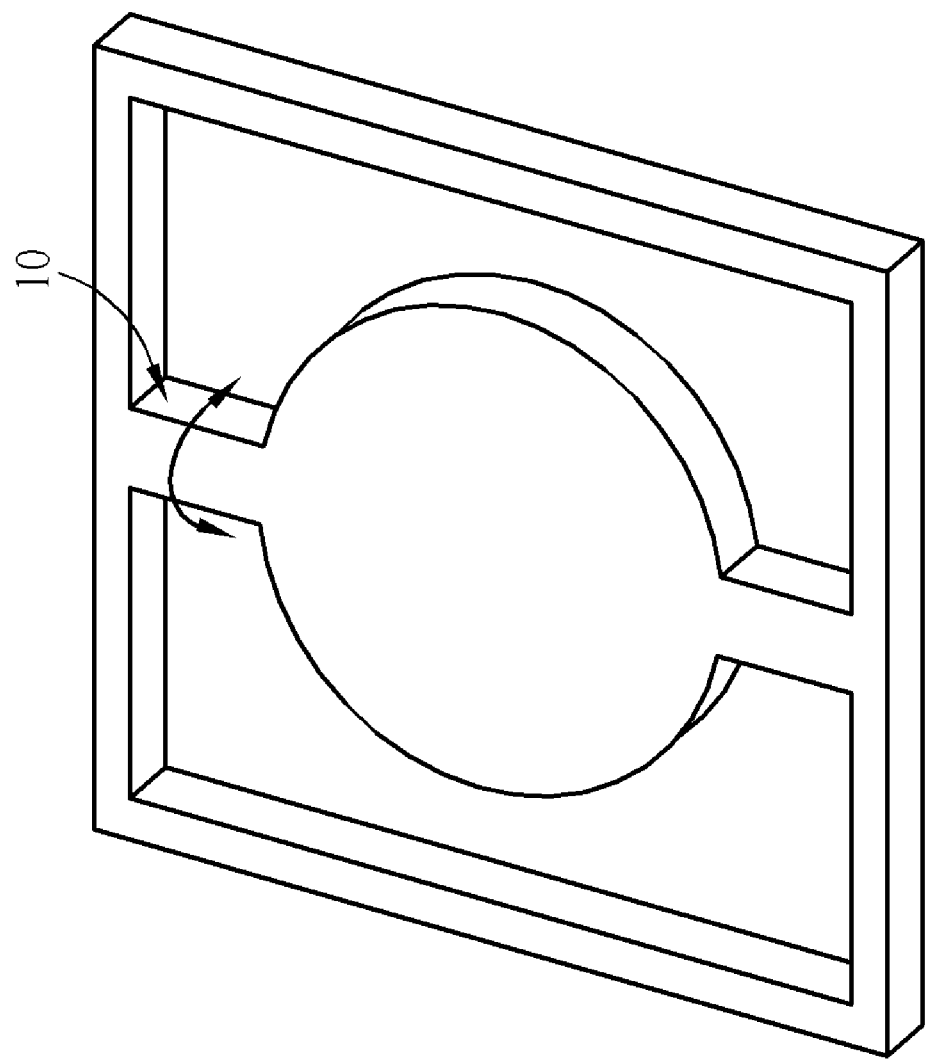
FIG. 3 is a schematic diagram of a single-axis micro hinge made by the prior art method.
Figure 4:
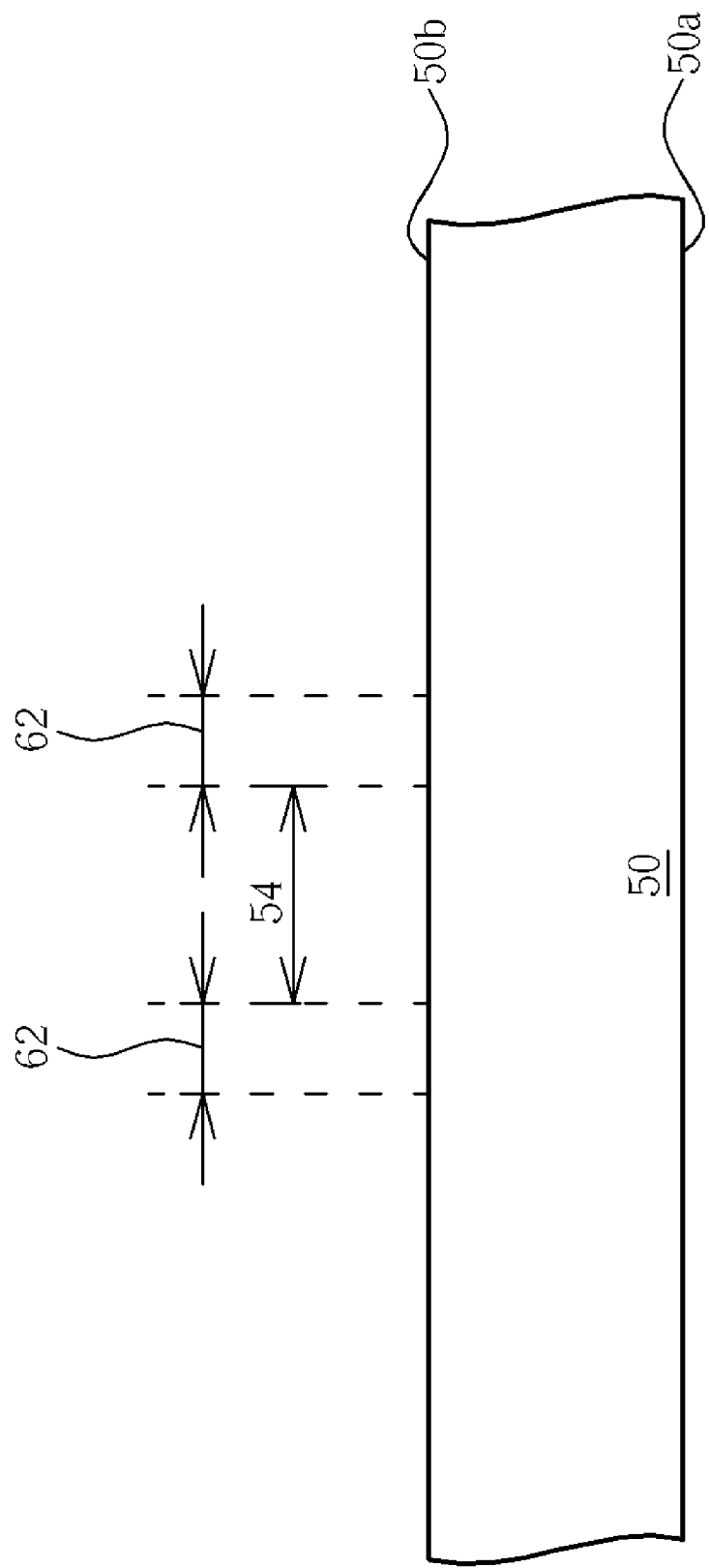
FIG. 4 through FIG. 12 are schematic diagrams illustrating a method of forming a hinge according to a preferred embodiment of the present invention.

Please refer to FIG. 4 through FIG. 12. FIG. 4 through FIG. 12 are schematic diagrams illustrating a method of forming a hinge according to a preferred embodiment of the present invention. As shown in FIG. 4, a wafer 50, such as a silicon wafer, is provided, and the wafer 50 comprises a first surface 50a and a second surface 50b. The second surface 50b is usually the front side of a wafer, having many devices and components thereon, and the first surface 50a is usually the backside of a wafer. At least a hinge region 54 and at least two through regions 62 are defined on the wafer 50. The hinge region 54 is a predetermined position of a hinge, and the two through regions 62 are located on two sides of the hinge region.

Figure 5:
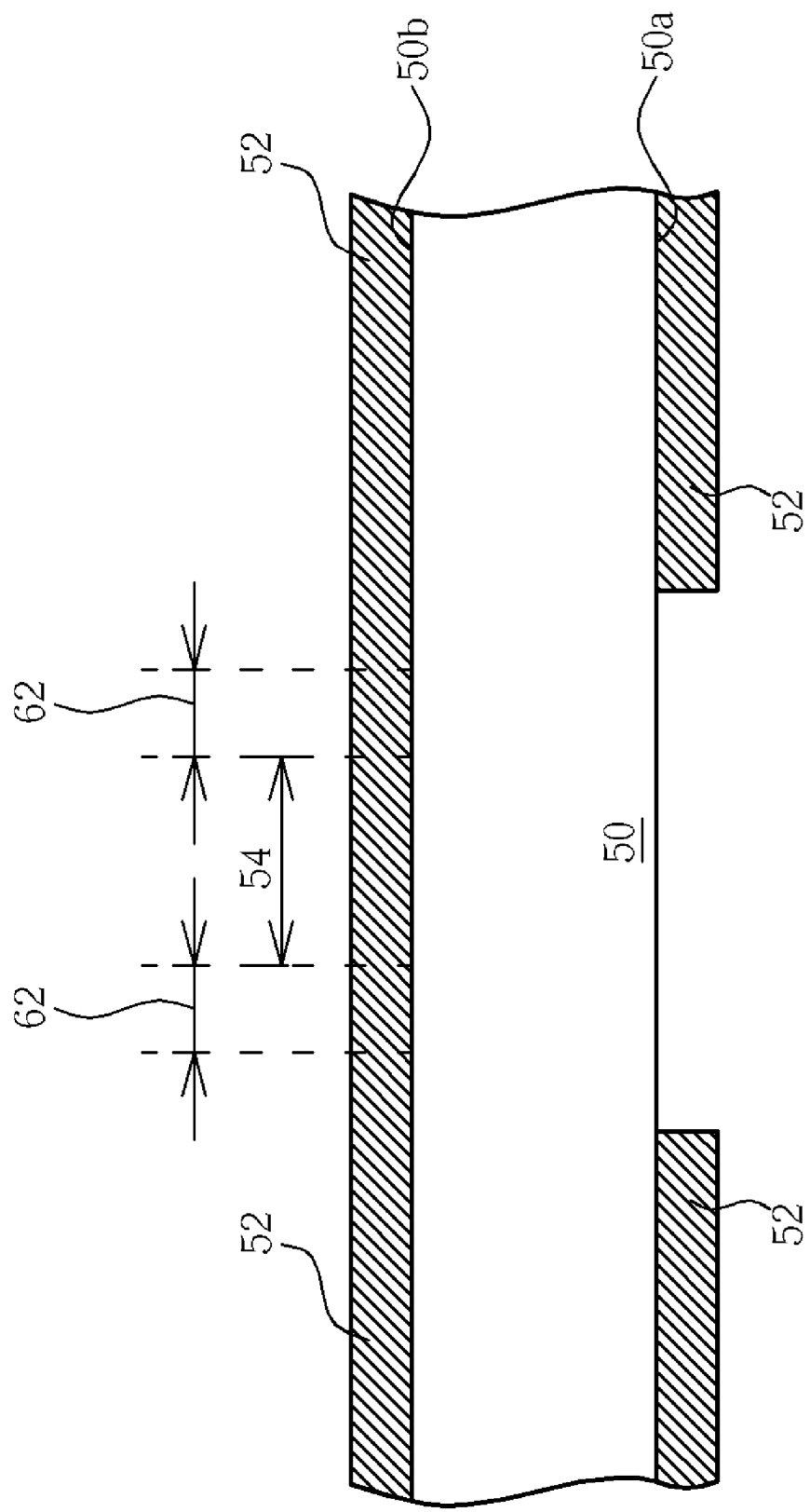

As shown in FIG. 5, an etching mask 52 is next formed on the first surface 50a and the second surface 50b of the wafer 50. The etching mask 52 should expose at least the hinge region 54 in the first surface 50a, and it can further expose the two through regions 62 on the first surface 50a and parts of the wafer 50 located around the two through regions 62 optionally. The material of the etching mask 52 can be selected from nitride, oxide, or photoresist. In order to simplify the description, the embodiment takes an etching mask 52 made by nitride as an example. It is to be understood that the forming method of the etching mask 52 is known in the art and thus not explicitly shown in the drawings.

Figure 6:
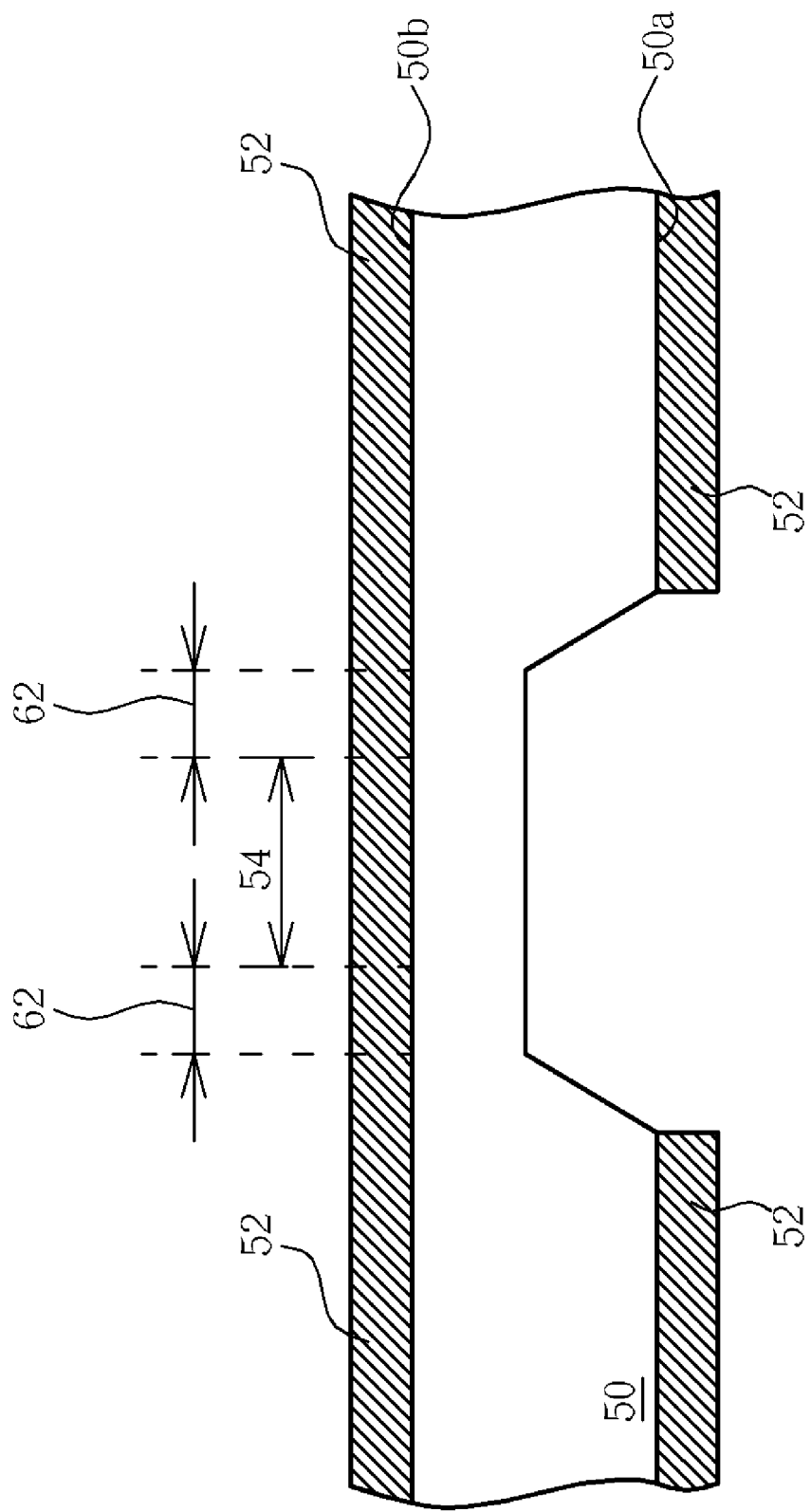
Figure 7:
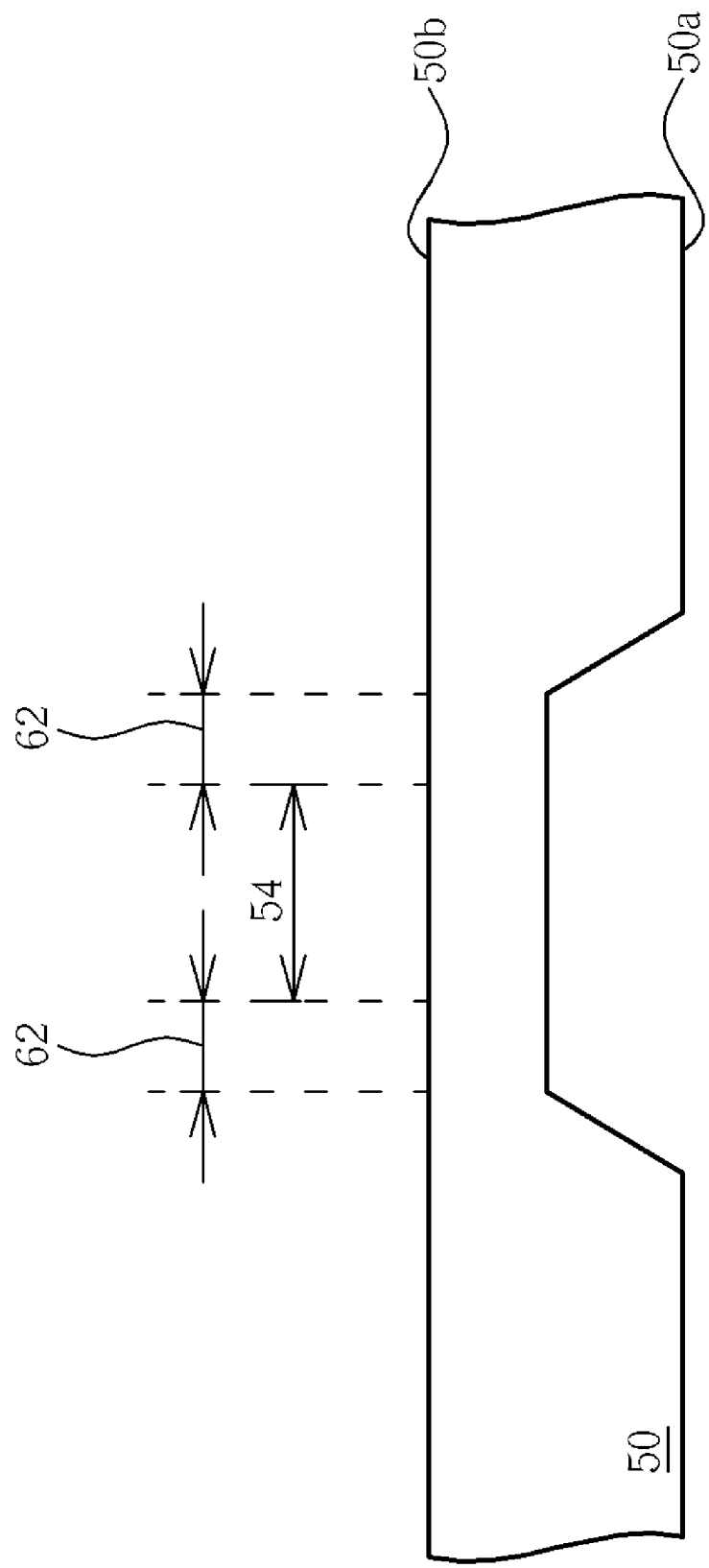

As shown in FIG. 6, an etching process is thereafter performed by utilizing the etching mask 52. The etching process etches the wafer 50 in the hinge region 54 from the first surface 50a until a predetermined depth is reached. The etching process can be adjusted depending on the factors, such as the material of the etching mask 52 or the required cavity shape. For instance, as the etching mask 52 is made by nitride, and a wet etching process using potassium hydroxide solution is performed to form a cavity, which has a cross-sectional area getting larger outward, in the first surface 50a of the wafer 50. The cavity might be formed across the hinge region 54 and the two through regions 62. If the etching mask 52 is made by oxide or photoresist, a dry etching process, such as a reactive ion etching (RIE), can be performed so as to form a cavity, which has a vertical sidewall (not shown in the figure). As shown in FIG. 7, after the general thickness of the hinge region 54 is formed, the etching mask 52 is subsequently removed.

Figure 8:
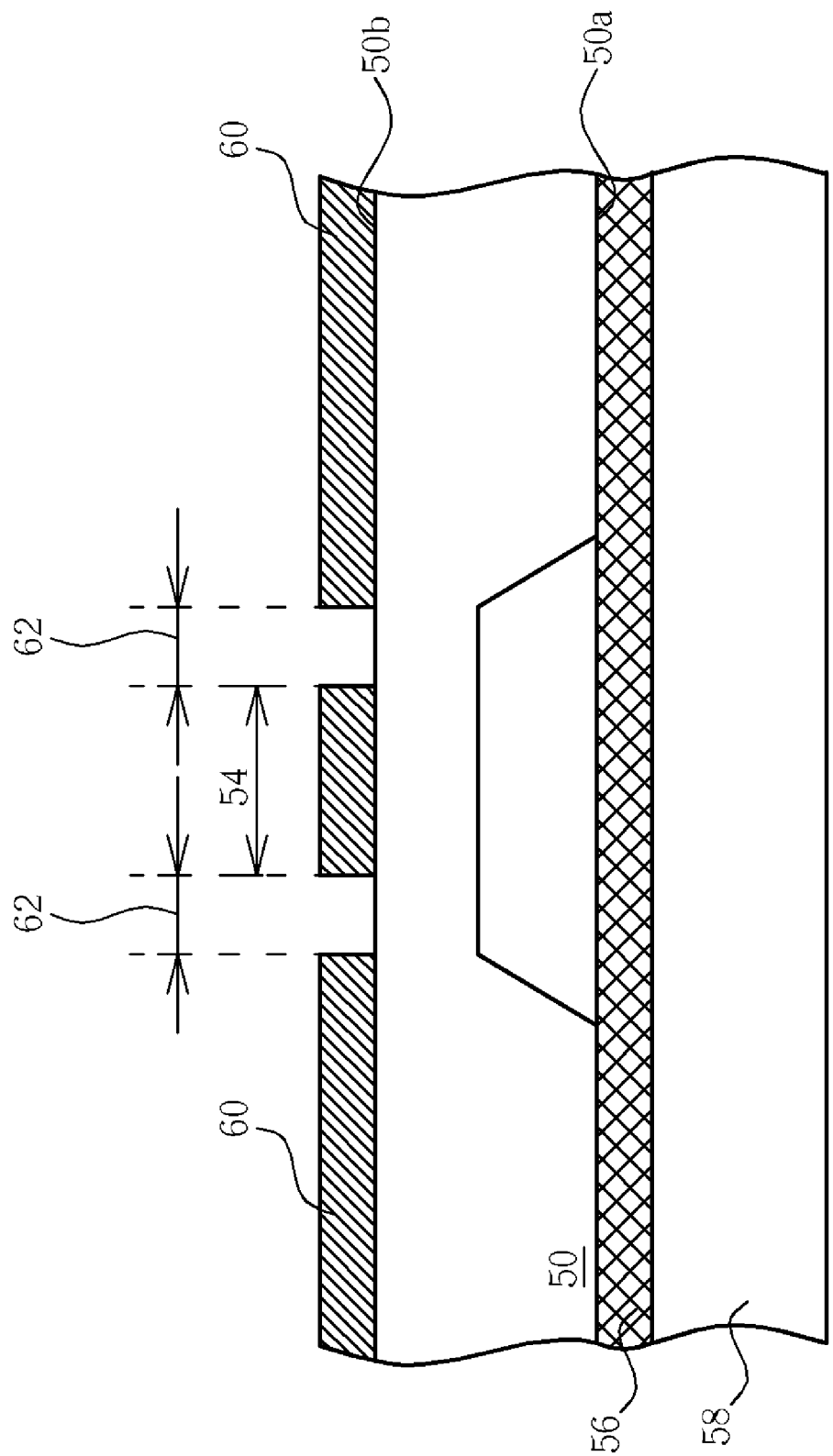

As shown in FIG. 8, a bonding layer 56 is utilized to bond the first surface 50a of the wafer 50 and a carrier 58 together. Afterward, another etching mask 60 is formed on the second surface 50b of the wafer 50 to define the dimensions of two through regions 62. In this embodiment, the material of the bonding layer 56 is selected from photoresist, metal, silicon oxide, benzocyclobutene (BCB), polyimide, tape, UV tape, wax, and so on. The etching mask 60 is selected from oxide or photoresist. The carrier 58 is selected from materials compatible to semiconductor processes, such as silicon, glass, quartz, and ceramics.

Figure 9:
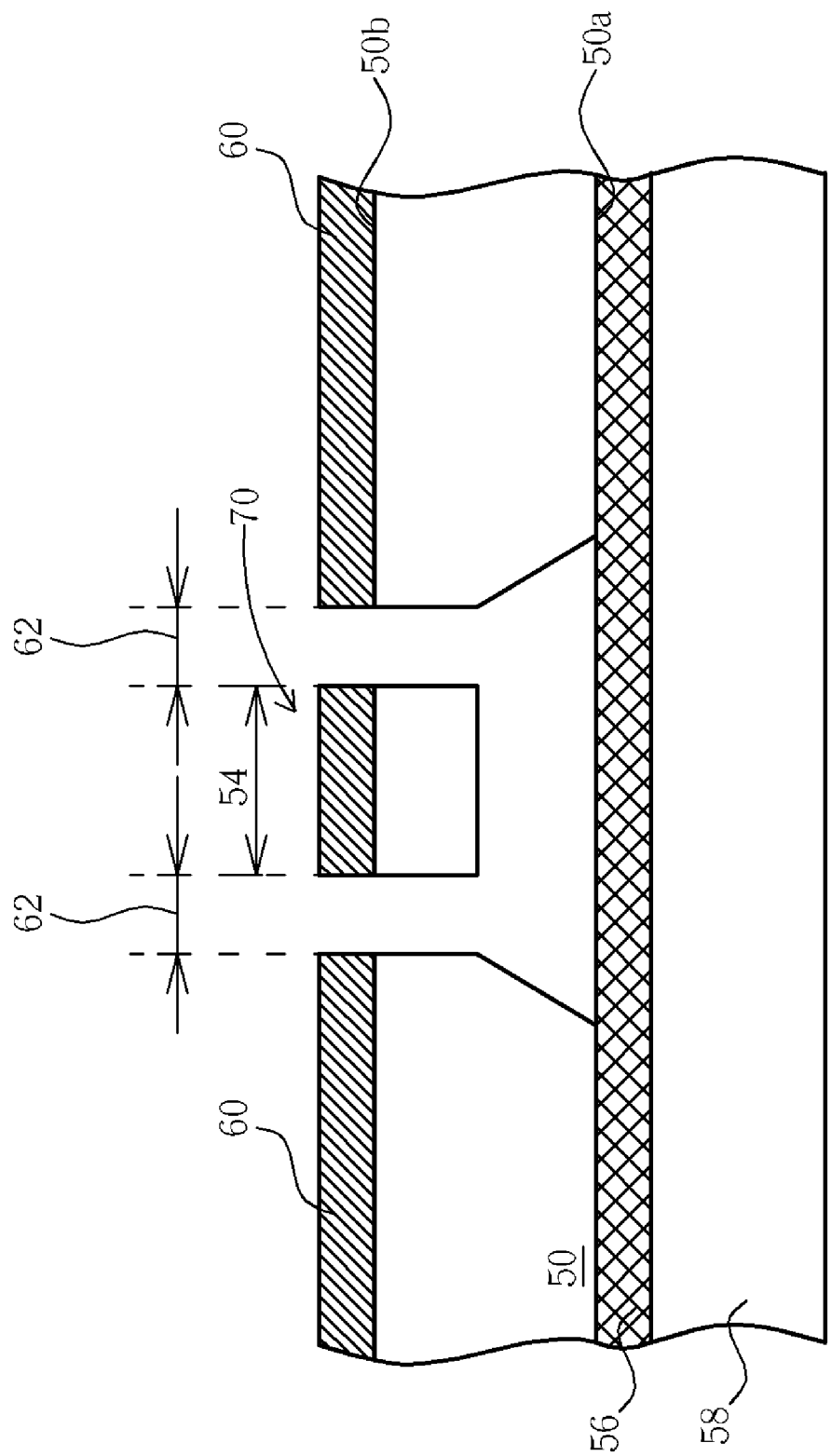

As shown in FIG. 9, another etching process, such as an inductive coupling plasma (ICP) or a deep reactive ion etch (DRIE), is performed to remove the wafer 50 unprotected by the etching mask 60 in the through regions 62. The etching process is continued until etching through wafer 50 in the through regions so as to form a hinge 70. It is noteworthy that when the etching process is performed down to the depth shown in FIG. 6, the wafer 50 in the hinge region 54 is suspended. In addition, since the wafer 50 in the hinge region 54 is not adhered to the bonding layer 56, side-etching effect will not occur. In other words, the structure of the hinge 70 will not be damaged by the etching process, and it can have the predetermined shape. As a result, the hinge 70 has a great reliability.

Figure 10:
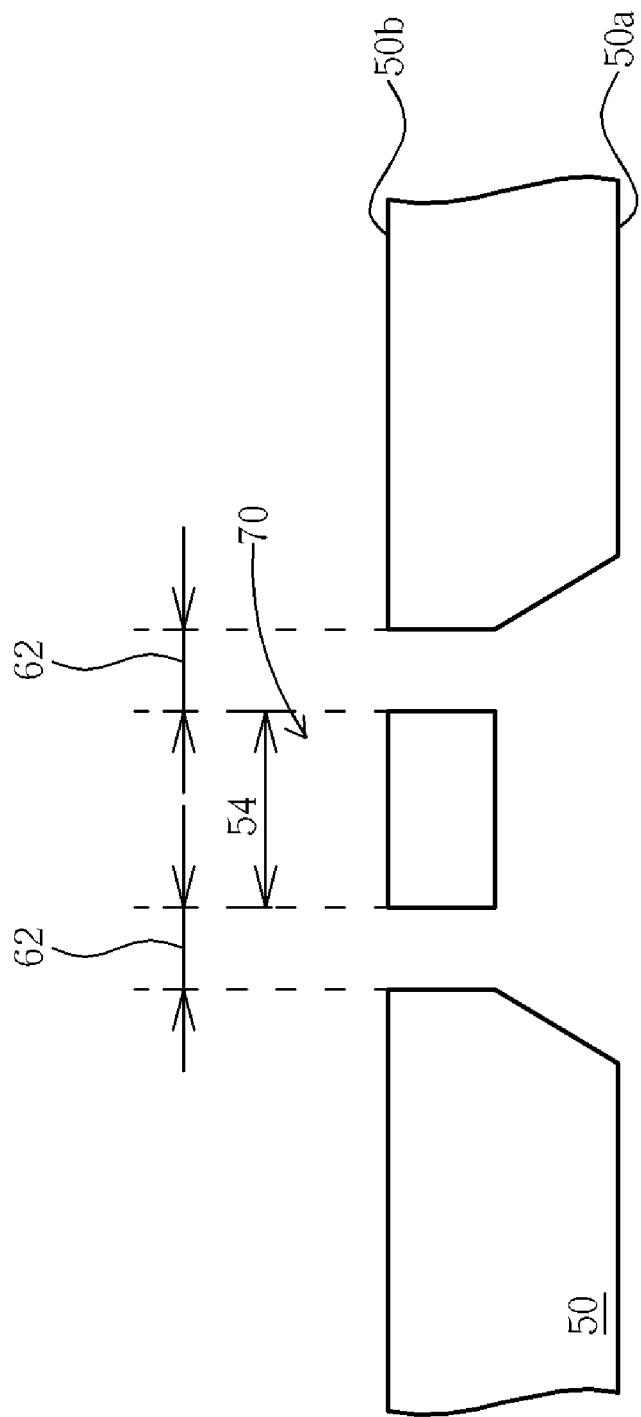

As shown in FIG. 10, after forming the hinge 70 roughly, the etching mask 60 that covers the second surface 50b of the wafer 50 is removed. Subsequently, the wafer 50 accepts a wafer level test, such as a wafer level resonance frequency test (the testing condition is not shown in figure). Before the wafer level test, the bonding layer 56 can be removed as required. Since the wafer 50 located in the hinge region 54 is suspended at this time, it has no need to put the wafer level test off until the whole manufacturing process is completed. The wafer level test can be performed in situ in the manufacturing process of the hinge 70.

According to the test data of the wafer level test, the wafer 50 can be etched again so as to adjust the geometric shape of the hinge 70, and to reach the required specification of the product. For example, the wafer 50 is etched from the first surface 50a of the wafer 50 in FIG. 11, and the etching process is performed from the second surface 50b of the wafer 50 in FIG. 12.

Figure 11:
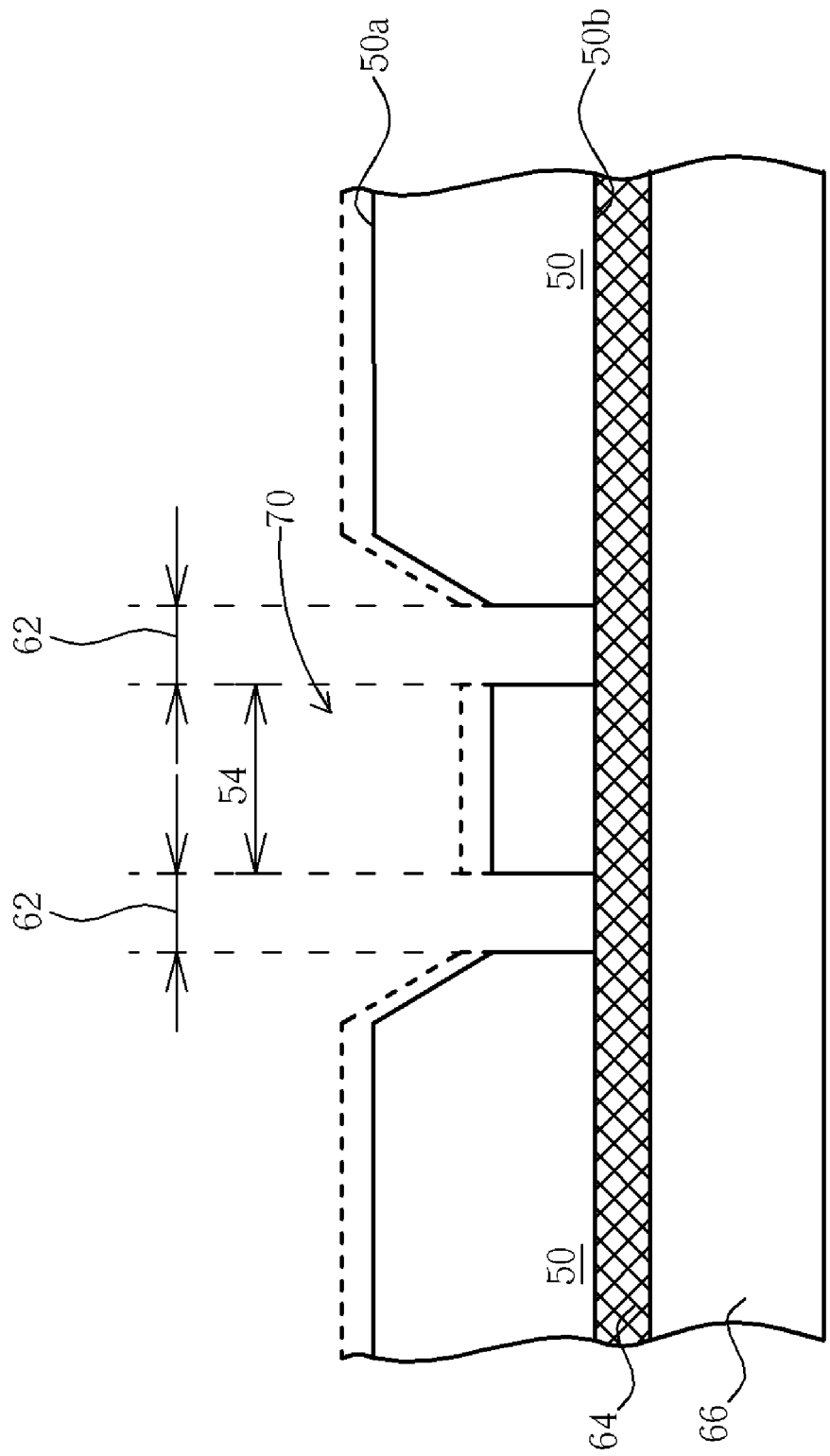

As shown in FIG. 11, a bonding layer 64 is utilized to bond the second surface 50b of the wafer 50 and a carrier 66 together. Afterward, another dry etching process is performed so as to etch the overall wafer 50 from the first surface 50a. The dry etching process is used to adjust the geometric shape of the hinge 70, especially the thickness of the hinge 70. Before this dry etching process, another etching mask can be optionally formed on the wafer 50 to protect parts of the wafer 50 as required.

Figure 12:
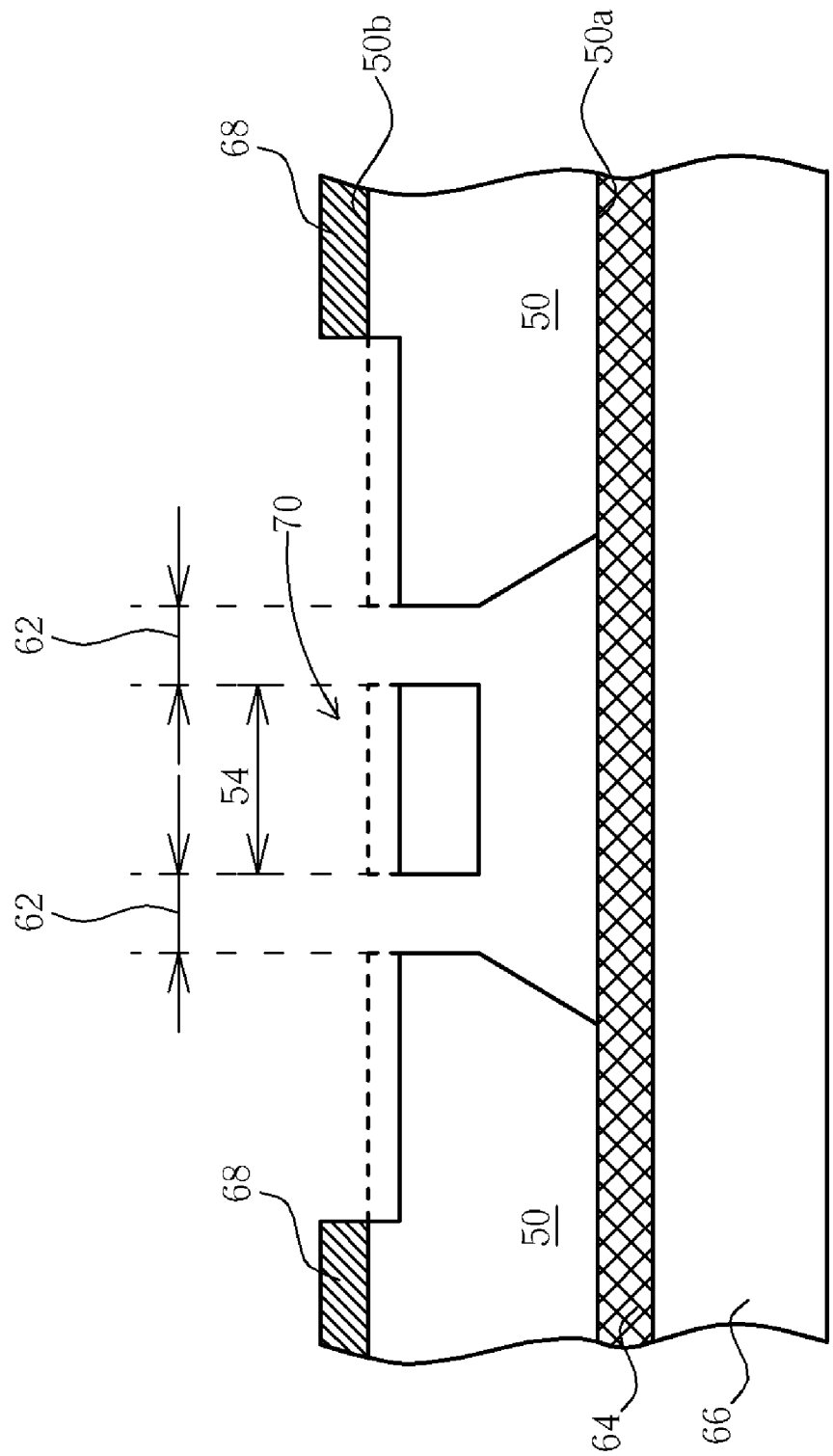

As shown in FIG. 12, a bonding layer is used to attach the first surface 50a of the wafer 50 to a carrier 66, and an etching mask 68 is further formed on the second surface 50b of the wafer 50. The etching mask 68 covers some regions that should be protected, such as regions including other components, and exposes at least the hinges 70 in the hinge region 54. Afterward, an etching process is performed so as to etch parts of the wafer 50, which are not protected by the etching mask 68, from the second surface 50b. The etching process is used to adjust the geometric shape of the hinge 70. Next, the etching mask is removed (not shown in the figure), and the adjusted hinge is produced.

Thereafter, the above-mentioned step of wafer level test and the step of adjusting the hinge 70 can be repeated so as to confirm whether the hinge 70 can satisfy the specification of the product. In addition, the above-mentioned adjusting step can be performed on all hinges 70 in a wafer 50 in one time, or it can be performed on only some of the hinges 70 in a wafer 50 so as to adjust each hinge 70 individually.

Therefore, the method of the present is able to prevent excessive variation in overall area during the etching process and the side-etching problem while the etching process is performed down to the etching stop layer. In addition, because the first surface 50a of the hinge 70 does not adhere to the bonding layer 56 and 64, the step of removing the bonding layer 56 will not damage the hinge 70. Consequently, the reliability and stress-bearing capability of the micro hinge is ensured.

On the other hand, because the wafer 50 in the hinge region 54 is etched from the first surface 50a of the wafer 50 so as to reduce the thickness of the hinge 70 generally, the thickness of the hinge 70 is no longer limited to the thickness of the wafer 50. Furthermore, since the thickness of the hinge 70 is thinner than the thickness of the wafer 50, the hinge 70 can suspend in the wafer 50, accept wafer level test, and be adjusted in situ. Thus, the present invention can ensure that the hinge 70 satisfies the specifications of the product precisely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a hinge, comprising:

providing a wafer comprising a first surface and a second surface, the wafer defining at least a hinge region and at least two through regions, the two through regions being respectively positioned on two sides of the hinge region;

removing parts of the wafer in the hinge region from the first surface of the wafer;

removing the wafer in the two through regions from the second surface of the wafer until the wafer is removed through to the first surface so as to form a hinge, wherein the hinge and the wafer are monolithically-formed;

performing a wafer level test on the wafer; and etching the wafer after the wafer level test so as to adjust a geometric shape of the hinge according to a test datum of the wafer level test.

2. The method as claimed in claim 1, wherein the step of removing the parts of the wafer in the hinge region forms a cavity, which has a cross-sectional area getting larger outward, in the first surface of the wafer.

3. The method as claimed in claim 1, wherein the wafer accepts a wafer level resonance frequency test in the step of performing the wafer level test.

4. The method as claimed in claim 1, wherein the step of removing parts of the wafer in the hinge region is performed by means of etching.

5. The method as claimed in claim 1, wherein the step of removing the wafer in the two through regions is performed by means of etching.

6. The method as claimed in claim 1, wherein the second surface of the wafer is bonded to a carrier with a bonding layer in the step of removing the parts of the wafer in the hinge region.

7. The method as claimed in claim 1, wherein the first surface of the wafer is bonded to a carrier with a bonding layer in the step of removing the wafer in the two through regions, and the bonding layer does not contact the wafer in the hinge region.

8. The method as claimed in claim 1, wherein the step of removing the parts of the wafer in the hinge region comprises:
   forming an etching mask on the first surface of the wafer, the etching mask exposing the hinge region;
   etching parts of the wafer, which are not covered by the etching mask, from the first surface; and
   removing the etching mask.

9. The method as claimed in claim 1, wherein the step of adjusting the geometric shape of the hinge is performed by means of a dry etching process.

10. The method as claimed in claim 1, wherein the step of adjusting the geometric shape of the hinge etches the wafer from the first surface.

11. The method as claimed in claim 1, wherein the step of adjusting the geometric shape of the hinge etches the wafer from the second surface.

12. The method as claimed in 1, wherein the step of adjusting the geometric shape of the hinge changes a thickness of the hinge.

13. The method as claimed in claim 1, wherein the step of adjusting the geometric shape of the hinge comprises:
   bonding the second surface of the wafer to a carrier with a bonding layer; and performing an etching process to etch the wafer from the first surface of the wafer.

14. The method as claimed in claim 1, wherein the step of adjusting the geometric shape of the hinge comprises:
   forming an etching mask on the second surface of the wafer, the etching mask exposing the hinge region;
   performing an etching process to etch parts of the wafer, which are not covered by the etching mask, from the second surface; and
   removing the etching mask.

* * * * *